(12) United States Patent
Lauchner

(10) Patent No.: US 6,807,062 B2
(45) Date of Patent: Oct. 19, 2004

(54) EMPLOYMENT OF AN OVER-BENT LEDGE OF A RACK COMPONENT TO SUPPORT AN OVER-BENT LEDGE OF A DROP-IN CHASSIS

(75) Inventor: Craig Edward Lauchner, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 52 days.

(21) Appl. No.: 10/289,975

(22) Filed: Nov. 7, 2002

(65) Prior Publication Data

US 2004/0090750 A1 May 13, 2004

(51) Int. Cl.[7] .................................................. H05K 7/16
(52) U.S. Cl. ..................... 361/725; 312/223.3; 248/664; 364/708.1
(58) Field of Search ................................. 361/724–727, 361/680–687, 608–609; 312/9.2, 223.1–223.6; 248/664; 422/52; 364/708.1

(56) References Cited

U.S. PATENT DOCUMENTS 5,587,877 A * 12/1996 Ryan et al. .................. 361/683
6,517,777 B2 * 2/2003 Liljestrand et al. ........... 422/52
6,600,656 B1 * 7/2003 Mori et al. .................. 361/724

* cited by examiner

Primary Examiner—Hung Van Duong

(57) ABSTRACT

An apparatus in one example comprises a rack component that supports a drop-in chassis. The rack component comprises an over-bent ledge and the drop-in chassis comprises an over-bent ledge. Upon installation of the drop-in chassis to the rack component the over-bent ledge of the rack component serves to support the over-bent ledge of the drop-in chassis. A shape of the over-bent ledge of the rack component promotes an increase of a holding effect between the drop-in chassis and the rack component.

32 Claims, 5 Drawing Sheets

EMPLOYMENT OF AN OVER-BENT LEDGE OF A RACK COMPONENT TO SUPPORT AN OVER-BENT LEDGE OF A DROP-IN CHASSIS

BACKGROUND

In one design, a server/storage device is connected to a server/storage device rack. The server/storage device is connected to a slide component. The slide component allows the server/storage device to extend out from the server/storage device rack. The slide component has an inner slide component and an outer slide component. The inner slide component fits within a track in the outer slide component. The inner slide component is preinstalled to the server/storage device. The outer slide component is preinstalled to the server/storage device rack. To install the server/storage device into the server/storage device rack the inner slide component is precisely aligned into the track in the outer slide component. The inner slide follows in the track until the server/storage device reaches a predetermined resting location on the server/storage device rack.

As one shortcoming, it is very difficult to precisely align the inner slide component with the track in the outer slide component. Misalignment of the inner slide component with the track in the outer slide component can damage the slide component. Misaligned server/storage devices that are heavy cause more damage to the slide component than lighter server/storage devices. Therefore when installing heavy server/storage devices to the server/storage device rack precision alignment is essential.

In another design, the server/storage device is supported by the slide component. The slide component allows the server/storage device to extend out from the server/storage device rack. The slide component is preinstalled to the server/storage device rack. The slide component has the inner slide component and the outer slide component. The slide component has two ledges on opposite sides. The ledges are perpendicular to the direction of gravity. The server/storage device has two ledges on opposite sides. The ledges are perpendicular to the direction of gravity. To install the server/storage device into the server/storage device rack the slide component is fully extended out from the server/storage device rack. The server/storage device is placed onto the slide component. The ledges of the slide component align with and support the ledges of the server/storage device. Screws are placed through the inner slide component and into the server/storage device to secure the support.

As one shortcoming, the ledges of the server/storage device can easily slip off from the ledges of the slide component. If the ledges of the server/storage device slip off from the ledges of the slide component it would be possible to damage the server/storage device. Therefore when installing the server/storage device to the slide component secure support between the ledges is essential. As another shortcoming, the slides must be extended during installation and it takes additional time and tools to install screws through the inner slide into the server/storage device.

SUMMARY

The invention in one embodiment encompasses an apparatus. The apparatus includes a rack component that supports a drop-in chassis. The rack component comprises an over-bent ledge. The drop-in chassis comprises an over-bent ledge. Upon installation of the drop-in chassis to the rack component the over-bent ledge of the rack component serves to support the over-bent ledge of the drop-in chassis. A shape of the over-bent ledge of the rack component promotes an increase of a holding effect between the drop-in chassis and the rack component.

Another embodiment of the invention encompasses an apparatus. The apparatus includes a rack component providing support for a drop-in chassis. The rack component comprises an bracket. The drop-in chassis comprises an over-bent ledge. Upon installation of the drop-in chassis to the rack component the bracket comprises a mating relationship with the over-bent ledge. The rack component comprises a slide component. The slide component extends away from the rack component. A fastening component attaches the drop-in chassis to the slide component. The fastening component prevents the slide component from bowing away from the drop-in chassis.

Yet another embodiment of the invention encompasses a method. An over-bent ledge of a drop-in chassis is supported with an over-bent ledge of a rack component. A restraining component of the rack component is engaged with the drop-in chassis. A slide component of the rack component is prevented from bowing away from the drop-in chassis.

A further embodiment of the invention encompasses a method. A drop-in chassis is supported with a rack component. The drop-in chassis is restrained from slipping off of the rack component with a mating relationship between a stepped and/or angled over-bent ledge of the drop-in chassis and a stepped and/or angled over-bent ledge of the rack component.

DESCRIPTION OF THE DRAWINGS

Features of exemplary implementations of the invention will become apparent from the description, the claims, and the accompanying drawings in which:

DETAILED DESCRIPTION

Figure 1:
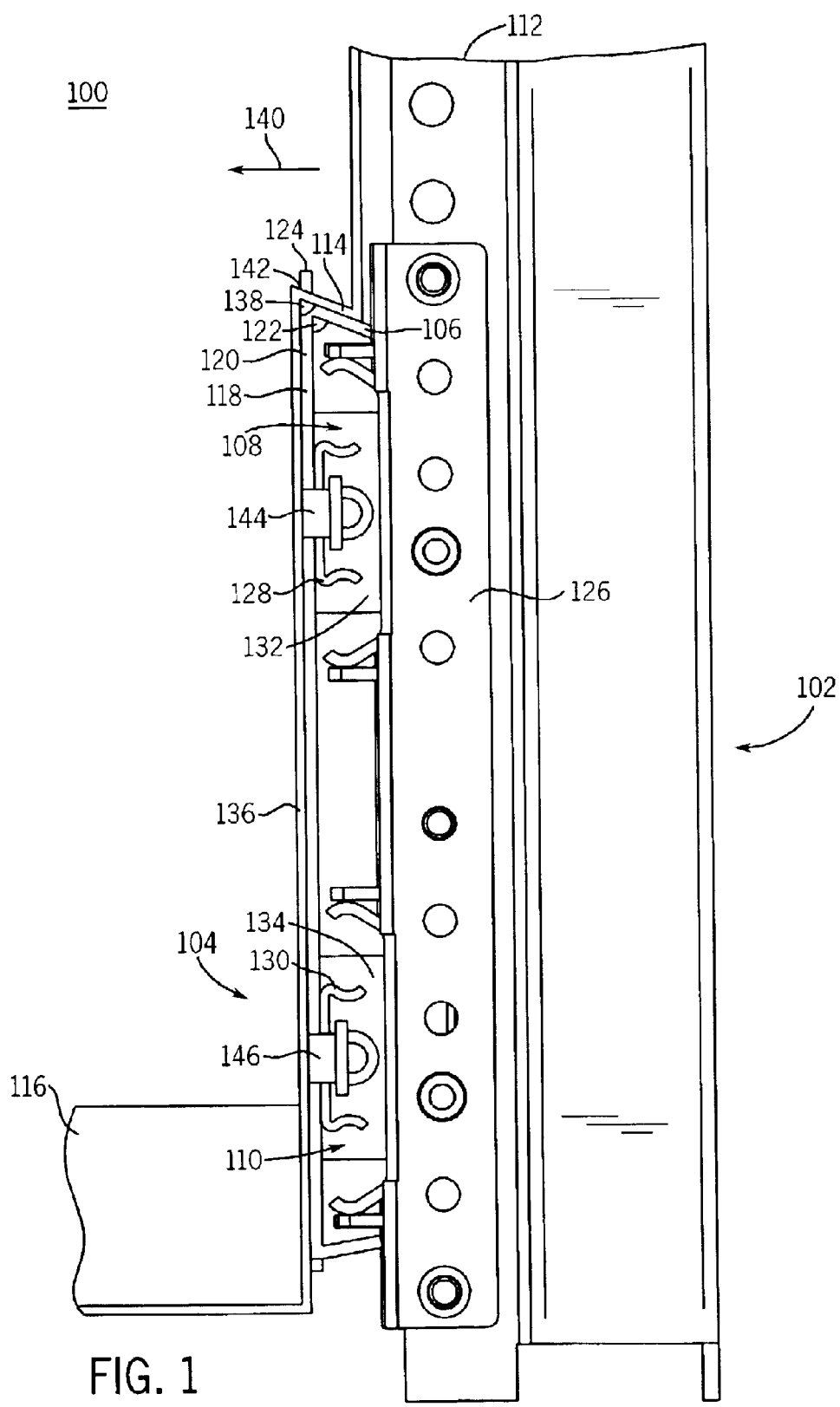
FIG. 1 is a representation of an apparatus that comprises one or more rack components and one or more drop-in chassis.

Turning to FIG. 1, an apparatus 100 in one example comprises a rack component providing support for a drop-in chassis. The rack component comprises an over-bent ledge. The drop-in chassis comprises an over-bent ledge. Upon installation of the drop-in chassis to the rack component the over-bent ledge of the rack component supports the over-bent ledge of the drop-in chassis. The over-bent ledge of the bracket promotes an increases of a holding effect between the drop-in chassis and the bracket. The apparatus 100 includes a plurality of components. A number of such components can be combined or divided in the apparatus 100.

The apparatus 100 comprises a rack component 102 and a drop-in chassis 104. The rack component 102 comprises an over-bent ledge 106, one or more slide components 108 and 110, and one or more support components 112. The drop-in chassis 104 comprises an over-bent ledge 114 and a device case 116.

In one example, the rack component 102 comprises a bracket 118. The bracket 118 comprises the over-bent ledge 106 and a side portion 120. The side portion 120 is generally parallel to a direction of gravity. The over-bent ledge 106 extends from the side portion 120. The over-bent ledge 106 is formed in a shape to promote a decrease in a movement of the drop-in chassis 104 relative to the bracket 118. The over-bent ledge 106 promotes the decrease in the movement upon a force applied to the drop-in chassis 104 in a direction generally perpendicular to the direction of gravity. The over-bent ledge 106 is angled, grooved, curved, teethed, or stepped to promote the decrease in the movement. In one example, the portion of the over-bent ledge 106 adjacent to the side portion 120 is higher, in the direction of gravity, than the portion of the over-bent ledge 106 extended away from the side portion 120. For example, an angle 122 between the side portion 120 and the over-bent ledge 106 is less than ninety degrees. In another example illustrated in FIG. 5, the over-bent ledge 106 comprises one or more steps 502 and 504 oriented to increase a holding effect between the drop-in chassis 104 and the bracket 118.

Figure 2:
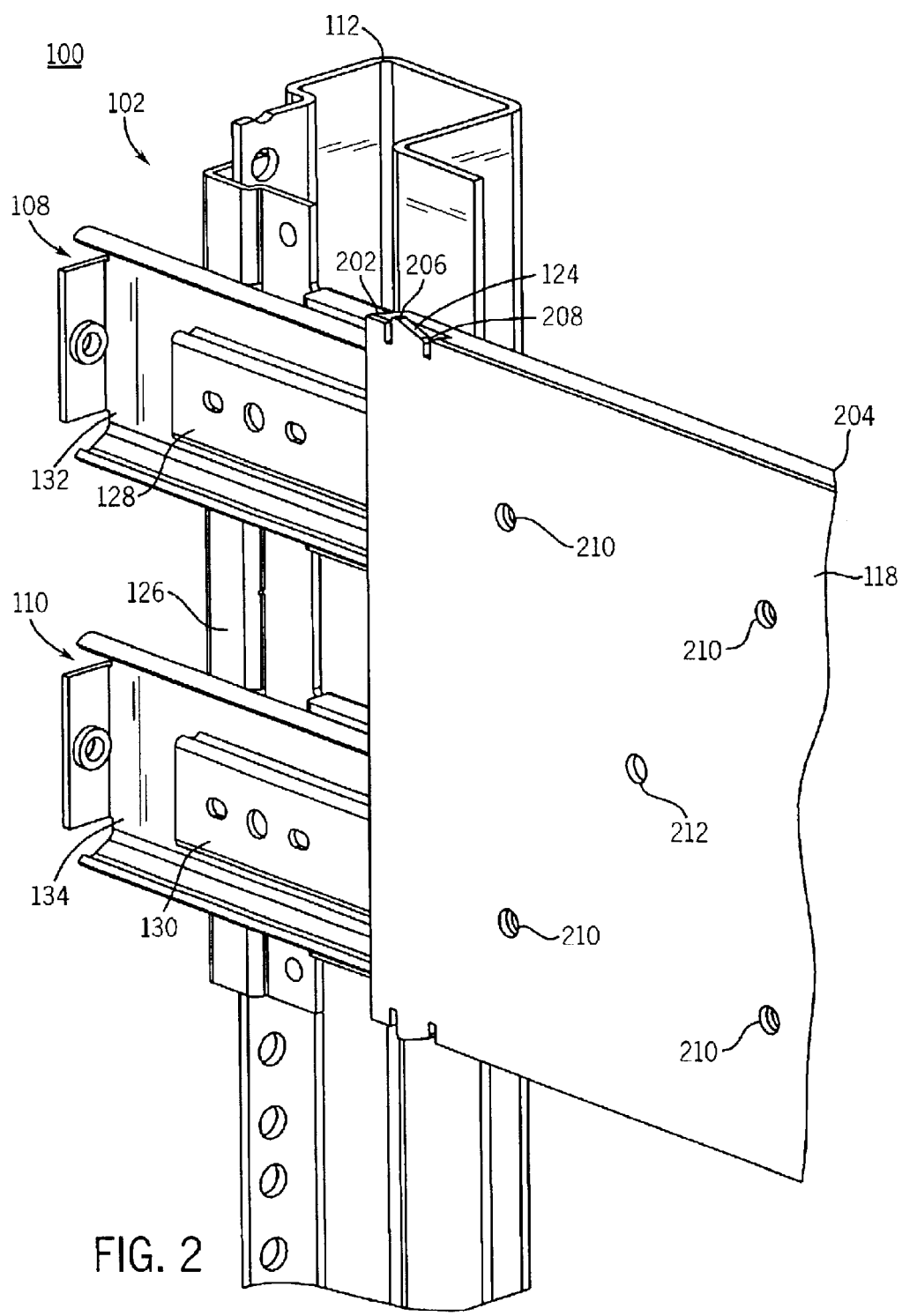
FIG. 2 is a representation of the one or more rack components of the apparatus of FIG. 1.
Figure 3:
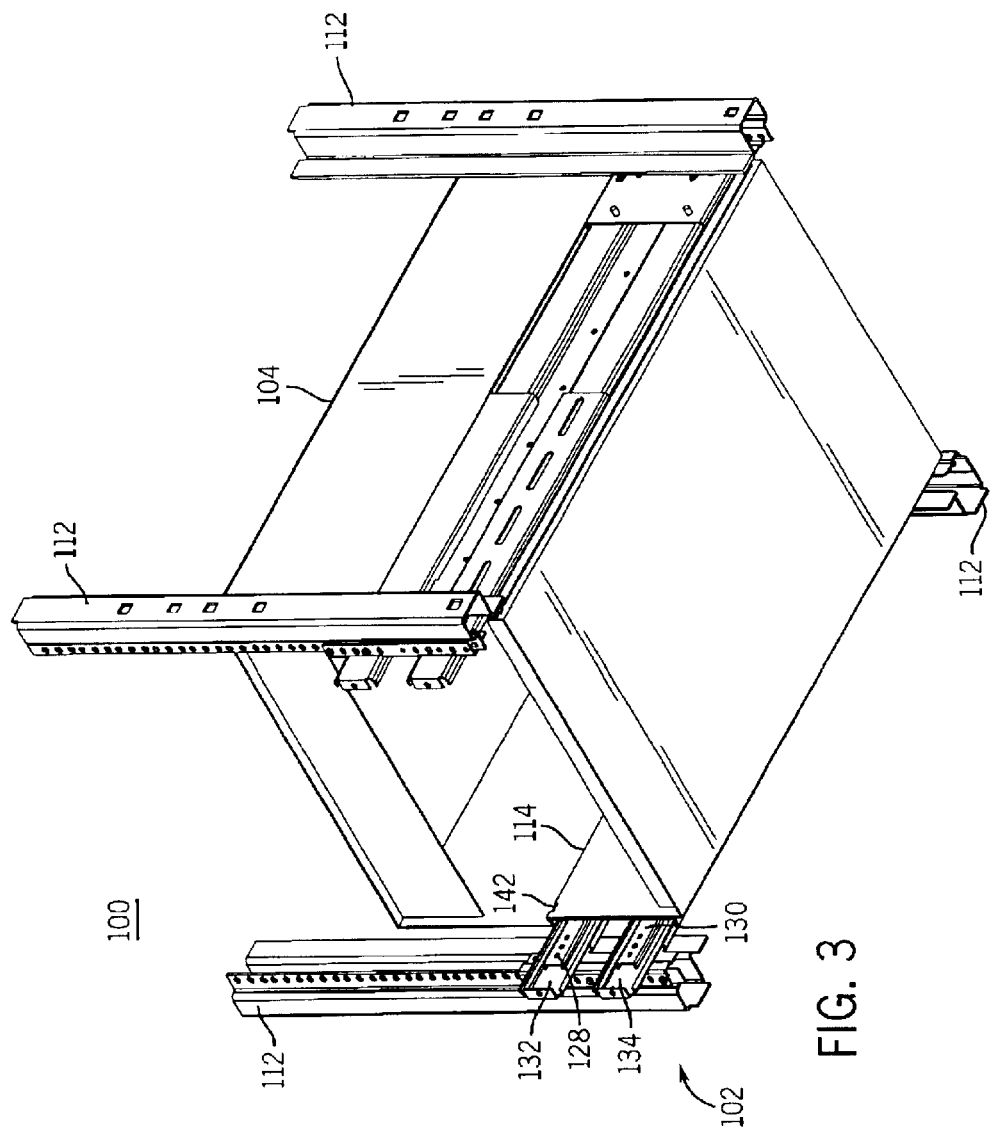
FIG. 3 is a representation of a connection between the one or more rack components and the one or more drop-in chassis of the apparatus of FIG. 1.
Figure 4:
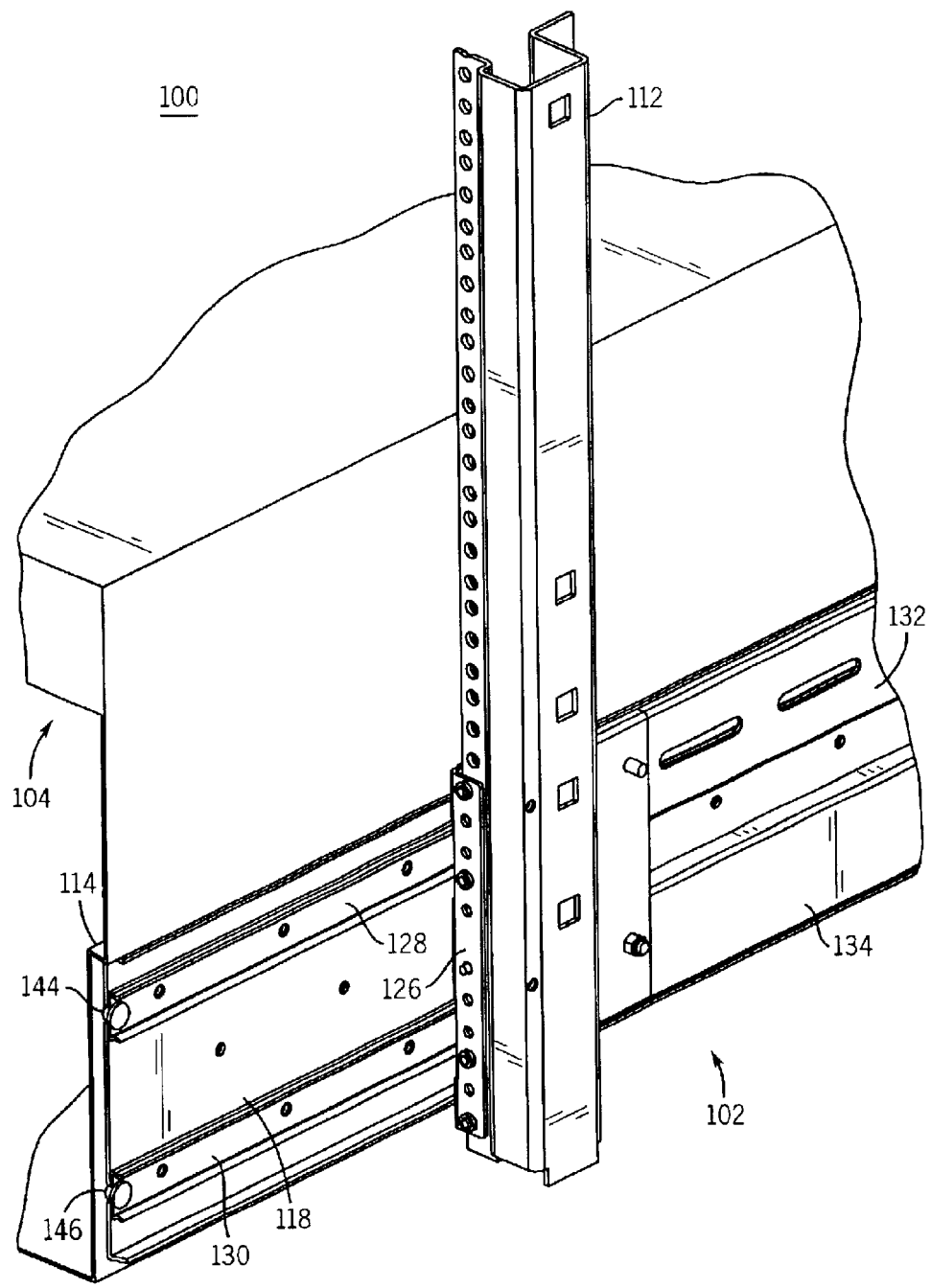
FIG. 4 is another representation of the connection between the one or more rack components and the one or more drop-in chassis of the apparatus of FIG. 1.

Referring to FIGS. 1–2, the bracket 118 comprises a first end 202 and a second end 204. During installation, the drop-in chassis 104 is slid on the bracket 118 from the second end 204 toward the first end 202. The bracket 118 comprises a restraining component 124. The restraining component comprises one or more of locking mechanisms, tabs, spring locks, and hooks. In one example, the restraining component 124 comprises a ramped tab. The ramped tab is located substantially near the first end 202. The ramped tab comprises a first end 206 and a second end 208. The first end 206 of the ramped tab is elevated, in the direction of gravity, above the second end 208, creating an incline from the second end 208 to the first end 206 of the ramped tab.

The bracket 118 is supported by the one or more slide components 108 and 110. The bracket 118 comprises one or more attachment holes 210. The bracket 118 is attached to the one or more slide components 108 and 110 by one or more of rivets, spot welding, pins, or screws. In one example, the one or more rivets are passed through the one or more attachment holes 210 into one or more aligned holes in the one or more slide components 108 and 110 and secured in place.

The bracket 118 comprises one or more integration holes 212. If an additional connection between the bracket 118 and the drop-in chassis 104 is desired, the bracket 118 is attached to the drop-in chassis 104 by one or more screws, pins, or rivets. In one example, the one or more screws are passed through the one or more integration holes 212 into one or more aligned holes in the drop-in chassis 104 and secured in place.

The one or more slide components 108 and 110 are mounted to the one or more support components 112 of the rack component 102. An attachment bracket 126 attaches the one or more slide components 108 and 110 to the one or more support components 112. In one example, the one or more slide components 108 and 110 comprise telescoping slide components. The one or more slide components 108 and 110 comprise an inner slide component 128 and 130 and an outer slide component 132 and 134. The outer slide component 132 is connected to the attachment bracket 126. The inner slide component 128 extends out from the outer slide component 132. The slide components 108 and 110 support the bracket 118. The drop-in chassis 104 extends out from the rack component 102 on the bracket 118.

The one or more support components 112 comprise one or more columns. The one or more support components 112 provide one or more attachment locations for the attachment bracket 126. The attachment bracket 126 connects the one or more slide components 108 and 110 to the one or more support components 112. The attachment bracket 126 connects to the one or more support components 112 by one or more pins, rivets, or screws. In one example, the one or more pins are passed through one or more aligned holes in the attachment bracket 126 into the one or more attachment locations and secured in place.

Referring to FIG. 1, the drop-in chassis 104 comprises a side portion 136 and the over-bent ledge 114. The side portion 136 is generally parallel to the direction of gravity. The over-bent ledge 114 extends from the side portion 136. The over-bent ledge 114 is formed to promote a decrease in a movement of the drop-in chassis 104 relative to the bracket 118. The over-bent ledge 114 promotes the decrease in the movement upon a force applied to the drop-in chassis 104 in a direction generally perpendicular to the direction of gravity. The over-bent ledge 114 is angled, grooved, curved, teethed, or stepped to promote the decrease in the movement. In one example, a portion of the over-bent ledge 114 connected to the side portion 136 is higher, in the direction of gravity, than a portion of the over-bent ledge 114 extended away from the side portion 136. For example, an angle 138 between the side portion 136 and the over-bent ledge 114 is less than ninety degrees. In one example, the angle 122 and the angle 138 are substantially equal. The size of the angles 122 and 138 is a design choice. Decrease the angles 122 and 138 to increase the holding effect of the over-bent ledge 114 to the over-bent ledge 106. Increase the angles 122 and 138 to decrease the friction observed during installation of the drop-in chassis 104 to the bracket 118.

Figure 5:
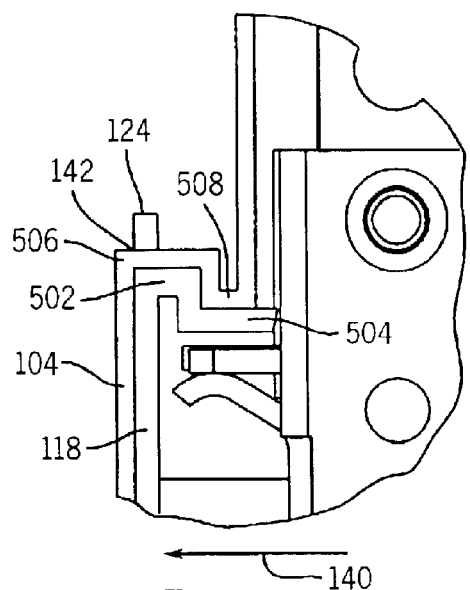
FIG. 5 is one representation of the over-bent connection between the one or more rack components and the one or more drop-in chassis of the apparatus of FIG. 1.

Referring to FIG. 5, in another example, the over-bent ledge 114 comprises one or more steps 506 and 508 oriented to increase the holding effect between the drop-in chassis 104 and the bracket 118. The one or more steps 506 and 508 have a mating relationship with the one or more steps 502 and 504. The movement of step 508 of the drop-in chassis 104 is constrained by the step 502 of the bracket 118. The step 502 inhibits the step 508 from a movement relative to the bracket 118 substantially in a general direction 140.

Referring to FIG. 1, the restraining component 124 in combination with the drop-in chassis 104 provides a location for the drop-in chassis 104 to rest on the bracket 118. Upon engagement of the restraining component 124 to the drop-in chassis 104 the restraining component 124 impedes at least a portion of a relative movement between the drop-in chassis 104 and the bracket 118. For example, the restraining component 124 impedes the drop-in chassis 104 from moving relative to the bracket 118 in at least one direction.

The device case 116 comprises a housing component to support and store one or more of electronic devices, computers, computer servers, and storage devices. In one example, the device case 116 comprises a shelf for the electronic device. In another example, the device case 116 comprises an outer portion of the electronic device.

An illustrative description of an installation of the drop-in chassis 104 to the rack component 102 is now presented, for explanatory purposes.

A user places the over-bent ledge 114 of the drop-in chassis 104 down onto the over-bent ledge 106 of the bracket 118. The user slides the drop-in chassis 104 from the second end 204 towards the first end 202. To ease the installation a friction reducing component may be added to one or more of the bracket 118 and the drop-in chassis 104. The friction reducing component is located between the bracket 118 and the drop-in chassis 104. The friction reducing component, in one example, comprises a plastic layer.

The drop-in chassis 104 is installed to the rack component 102 by resting the over-bent ledge 114 on the bracket 118. The angled, grooved, curved, teethed, or stepped shape of the over-bent ledges 114 and 106 promotes an increase of the holding effect between the drop-in chassis 104 and the bracket 118. The angled, grooved, curved, teethed, or stepped shape of the drop-in chassis 104 promotes a decrease in the likelihood that the drop-in chassis 104 would slip off of the bracket 118. The angled, grooved, curved, teethed, or stepped shape inhibits the drop-in chassis 104 from a movement relative to the bracket 118 in substantially the general direction 140. For the drop-in chassis 104 to move relative to the bracket 118 in substantially the general direction 140, a force must lift up the drop-in chassis 104 to disengage the holding effect. During installation, the force is unlikely to occur unintentionally due to the weight of the drop-in chassis 104.

In one example, the restraining component 124 comprises the ramped tab. Upon the over-bent ledge 114 of the drop-in chassis 104 reaching the ramped tab, the drop-in chassis 104 will rise up and over the ramped tab and continue to slide towards the first end 202 until the ramped tab aligns with a slot 142 in the drop-in chassis 104. When the ramped tab engages with the slot 142 the drop-in chassis 104 drops down onto the ramped tab securing the drop-in chassis 104 from sliding back towards the second end 204 of the bracket 118.

Referring to FIGS. 1–2, to disengage the ramped tab from the slot 142 the drop-in chassis 104 must be lifted up and over the ramped tab. The drop-in chassis 104 is sufficiently heavy to stay in place under normal conditions, therefore a force large enough to lift the drop-in chassis 104 off from the ramped tab is unlikely to occur unintentionally. However, if additional restraints are desired, screws may be passed through the one or more integration holes 212 into the one or more aligned holes in the drop-in chassis 104 and secured in place. The one or more integration holes 212 are advantageous in situations where the drop-in chassis 104 is installed to the rack component 102 and then shipped together. During shipment the drop-in chassis 104 may experience a force great enough to disengage the ramped tab from the slot 142. Securing the drop-in chassis 104 to the bracket 118 of the rack component 102 through the one or more integration holes 212 prevents the drop-in chassis 104 from falling off of the rack component 102 and incurring damage.

The drop-in chassis 104 extends out from the rack component 102 on the bracket 118 supported by the one or more slide components 108 and 110. To prevent damage to the one or more slide components 108 and 110 while the drop-in chassis 104 is extended out from the rack component 102, one or more fastening components 144 and 146 couple the one or more slide components 108 and 110 to the drop-in chassis 104. The fastening components 144 and 146 comprise one or more of pins, swaged pins, cotter pins, clips, and clamps. In one example, the one or more fastening components 144 and 146 connect to the slide components 108 and 110 at a location substantially near an end of the slide components 108 and 110. For example, the end that extends out the furthest from the rack component 102. The one or more fastening components 144 and 146 prevent the one or more slide components 108 and 110 from bowing away from the drop-in chassis 104. During installation, the one or more fastening components 144 and 146 restrain a further sliding of the drop-in chassis 104 once the drop-in chassis 104 has reached a predetermined location on the rack component 102. As the drop-in chassis 104 is contracted into the rack component 102, the one or more fastening components 144 and 146 will make contact with the rack component 102 which stops the further sliding.

Figure 6:
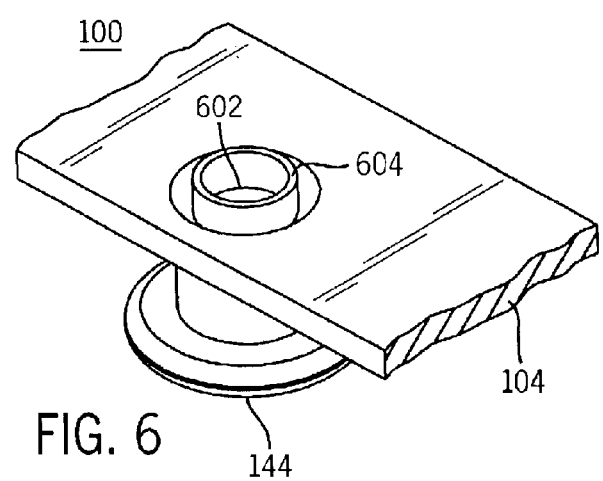
FIG. 6 is one representation of a pin used to couple the one or more drop-in chassis with one or more slide components of the one or more rack components of the apparatus of FIG. 1.
Figure 7:
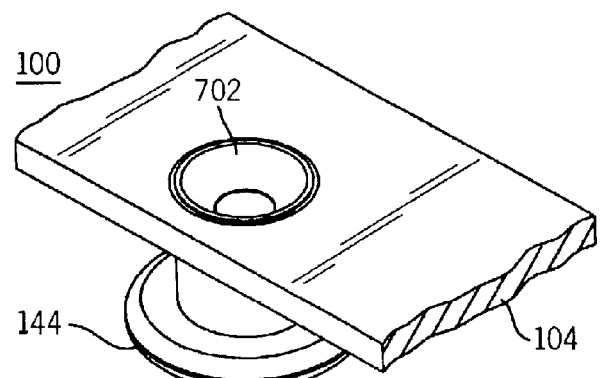
FIG. 7 is another representation of a pin used to couple the one or more drop-in chassis with the one or more slide components of the one or more rack components of the apparatus of FIG. 1.

Referring to FIGS. 6–7, in one example, the one or more fastening components 144 and 146 comprise a swaged pin. The swaged pin is inserted through the drop-in chassis 104 and swaged to secure the connection. The core 602 at an end of the swaged pin is hollowed out to form a ring 604. The ring 604 is bent outward from the core 602 forming a rim 702 at the end of the one or more swaged pins. The rim 702 is wider than a hole in the drop-in chassis 104 that the swaged pin passes through. Therefore, the swaged pin cannot be removed from the hole. In another example, the one or more fastening components 144 and 146 may be secured less permanently. The one or more fastening components 144 and 146 are pressed through the drop-in chassis 104. A cap wider than the hole in the drop-in chassis 104 is screwed onto the end of the one or more fastening components 144 and 146, therefore the fastening components 144 and 146 cannot be removed from the hole.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
   a rack component that supports a drop-in chassis;
   wherein the rack component comprises an over-bent ledge;
   wherein the drop-in chassis comprises an over-bent ledge;
   wherein upon installation of the drop-in chassis to the rack component the over-bent ledge of the rack component serves to support the over-bent ledge of the drop-in chassis;
   wherein a shape of the over-bent ledge of the rack component promotes an increase of a holding effect between the drop-in chassis and the rack component.

2. The apparatus of claim 1, wherein the rack component comprises a housing component for one or more electronic devices.

3. The apparatus of claim 1, wherein the drop-in chassis supports an electronic device.

4. The apparatus of claim 1, wherein the rack component comprises a bracket, wherein the bracket comprises the over-bent ledge of the rack component, wherein the bracket couples the drop-in chassis to the rack component.

5. The apparatus of claim 1, wherein the rack component comprises a restraining component, wherein upon engagement of the restraining component with the drop-in chassis the restraining component serves to prevent the drop-in chassis from moving relative to the over-bent ledge of the rack component.

6. The apparatus of claim 1, wherein the over-bent ledge of the drop-in chassis and the over-bent ledge of the rack component comprise a mating relationship.

7. The apparatus of claim 1, wherein the over-bent ledge of the rack component comprises one or more stepped portions, wherein the over-bent ledge of the drop-in chassis comprises one or more stepped portions, wherein the one or more stepped portions of the over-bent ledge of the drop-in chassis and the one or more stepped portions of the over-bent ledge of the rack component comprise a mating relationship.

8. The apparatus of claim 1, wherein the over-bent ledge of the rack component comprises one or more teeth, wherein the over-bent ledge of the drop-in chassis comprises one or more teeth, wherein the one or more teeth of the over-bent ledge of the drop-in chassis and the one or more teeth of the over-bent ledge of the rack component comprise a mating relationship.

9. The apparatus of claim 1, wherein the rack component comprises the over-bent ledge and a side portion, wherein the over-bent ledge extends from the side portion, wherein an angle between the over-bent ledge and the side portion is less than ninety degrees.

10. The apparatus of claim 1, wherein the drop-in chassis comprises the over-bent ledge and a side portion, wherein the over-bent ledge extends from the side portion, wherein an angle between the over-bent ledge and the side portion is less than ninety degrees.

11. The apparatus of claim 1, wherein the rack component comprises the over-bent ledge and a side portion, wherein the over-bent ledge extends from the side portion, wherein an angle between the over-bent ledge and the side portion of the rack component is less than ninety degrees;
wherein the drop-in chassis comprises the over-bent ledge and a side portion, wherein the over-bent ledge extends from the side portion, wherein an angle between the over-bent ledge and the aide portion of the drop-in chassis is less than ninety degrees;
wherein the angle between the over-bent ledge and the side portion of the rack component is substantially equal to the angle between the over-bent ledge and the side portion of the drop-in chassis.

12. The apparatus of claim 1, wherein a friction reducing component is located between the over-bent ledge of the rack component and the over-bent ledge of the drop-in chassis, wherein during installation the friction reducing component serves to assist a sliding of the over-bent ledge of the drop-in chassis on the over-bent ledge of the rack component.

13. The apparatus of claim 1, wherein the drop-in chassis comprises a portion with one or more first integration holes, wherein the rack component comprises a portion with one or more second integration holes, wherein a connection component employs the first and second integration holes to attach the drop-in chassis to the rack component.

14. The apparatus of claim 1, wherein the shape of the over-bent ledge of the rack component promotes a decrease of a relative movement in a general direction, wherein the decrease of the relative movement in the general direction promotes a decrease in the chance that the over-bent ledge of the drop-in chassis will disengage from the over-bent ledge of the rack component.

15. The apparatus of claim 4, wherein the rack component comprises a slide component, wherein the slide component supports the bracket, wherein the drop-in chassis extends from the rack component on the bracket supported by the slide component.

16. The apparatus of claim 5, wherein the restraining component comprises a ramped tap located substantially near a first end of the over-bent ledge of the rack component, wherein a aide of the ramped tap closer to the first end of the over-bent ledge of the rack component is taller than a side of the ramped tab closer to a second end of the over-bent ledge of the rack component;
wherein the drop-in chassis comprises a slot;
wherein upon installation the drop-in chassis slides from the second end towards the first end of the over-bent ledge of the rack component, wherein upon sliding of the slot in the drop-in chassis over the ramped tab the slot in the drop-in chassis engages with the ramped tab.

17. The apparatus of claim 7, wherein the one or more stepped portions of the drop-in chassis comprise a first stepped portion and a second stepped portion, wherein the first stepped portion is located relatively closer to a center of the drop-in chassis than is the second stepped portion;
wherein the second stepped portion is located relatively lower in a direction of gravity than is the first stepped portion.

18. The apparatus of claim 13, wherein the rack component comprises a bracket with the one or more second integration holes, wherein a connection component employs the one or more first and second integration holes to attach the drop-in chassis to the bracket.

19. The apparatus of claim 15, wherein a fastening component couples the slide component with the drop-in chassis.

20. The apparatus of claim 19, wherein the fastening component serves to impede the slide component from bowing away from the drop-in chassis.

21. The apparatus of claim 19, wherein the fastening component comprises a swaged pin, wherein the swaged pin extends into the drop-in chassis.

22. The apparatus of claim 19, wherein during installation and upon the drop-in chassis reaching a predetermined location on the rack component the fastening component serves to restrain the drop-in chassis from sliding past the predetermined location.

23. An apparatus, comprising:
a rack component providing support for a drop-in chassis;
wherein the rack component comprises an bracket, wherein the drop-in chassis comprises an over-bent ledge, wherein upon installation of the drop-in chassis to the rack component the bracket comprises a mating relationship with the over-bent ledge;
wherein the rack component comprises a slide component, wherein the slide component extends away from the rack component, wherein a fastening component attaches the drop-in chassis to the slide component, wherein the fastening component prevents the slide component from bowing away from the drop-in chassis.

24. The apparatus of claim 23, wherein upon extension from the rack component the slide component comprises a first end closer to the rack component than a second end, wherein the fastening component attaches the slide component to the drop-in chassis at a location substantially closer to the second end than the first end of the slide component.

25. The apparatus of claim 23, wherein the fastening component comprises a swaged pin passing through the slide component into the drop-in chassis.

26. The apparatus of claim 23, wherein the fastening component serves to restrain further sliding of the drop-in chassis upon the drop-in chassis reaching a predetermined location on the rack component.

27. A method, comprising the steps of:
supporting an over-bent ledge of a drop-in chassis with an over-bent ledge of a rack component, wherein the rack component comprises a side portion and the over-bent ledge, wherein an angle between the side portion and the over-bent ledge of the rock component is less than ninety degrees, wherein the drop-in chassis comprises a side portion and the over-bent ledge, wherein an angle between the side portion and the over-bent ledge of the drop-in chassis is less than ninety degrees;
engaging a restraining component of the rack component with the drop-in chassis; and
preventing a slide component of the rack component from bowing away from the drop-in chassis.

28. The method of claim 27, wherein the over-bent ledge of the rack component comprises a first end and a second end, wherein the restraining component is substantially near the second end, wherein the step of engaging the restraining component of the rack component with the drop-in chassis comprising the step of:
sliding the over-bent ledge of the drop-in chassis from the first end towards the second end of the over-bent ledge of the rack component until the restraining component attaches to the drop-in chassis.

29. The method of claim 27, wherein the step of preventing the slide component of the rack component from bowing away from the drop-in chassis comprises the steps of:
inserting a pin into the drop-in chassis;
fastening the pin to the drop-in chassis; and
coupling the slide component to the drop-in chassis with the pin.

30. A method, comprising the steps of:
supporting a drop-in chassis with a rack component;
restraining the drop-in chassis from slipping off of the rack component with a mating relationship between a stepped and/or angled over-bent ledge of the drop-in chassis and a stepped and/or angled over-bent ledge, of the rack component, wherein a stepped and/or angled shape of the stepped and/or angled over-bent ledge of the rack component and a stepped and/or angled shape of the stepped and/or angled over-bent ledge of the drop-in chassis serve to prevent the drop-in chassis from slipping off of the rack component.

31. The method of claim 30, wherein the drop-in chassis extends from the rack component on one or more slide components, and wherein the one or more slide components support the stepped and/or angled over-bent ledge of the rack component, the method further comprising the step of:
fastening the drop-in chassis with the slide component to prevent the slide component from bowing away from the drop-in chassis.

32. The method of claim 30, wherein the step of restraining the drop-in chassis from slipping off of the rack component with the mating relationship between the stepped and/or angled over-bent ledge of the drop-in chassis and the stepped and/or angled over-bent ledge of the rack component comprises the step of:
promoting an increase of a holding effect between the drop-in chassis and the rack component through contact in the mating relationship between the stepped and/or angled over-bent ledge of the drop-in chassis and the stepped and/or angled over-bent ledge or the rack component.

* * * * *